United States Patent
Aoki et al.

(10) Patent No.: US 8,610,135 B2
(45) Date of Patent: Dec. 17, 2013

(54) SUBSTRATE FOR MOUNTING LIGHT-EMITTING ELEMENTS, LIGHT-EMITTING DEVICE, AND METHOD FOR MANUFACTURING SAME

(75) Inventors: Dai Aoki, Tokyo (JP); Makoto Ida, Tokyo (JP); Shigehiro Kawaura, Tokyo (JP)

(73) Assignees: Stanley Electric Co., Ltd., Tokyo (JP); Nippon Carbide Industries Co., Inc., Tokyo (JP)

( * ) Notice: Subject to any disclaimer, the term of this patent is extended or adjusted under 35 U.S.C. 154(b) by 97 days.

(21) Appl. No.: 13/273,494

(22) Filed: Oct. 14, 2011

(65) Prior Publication Data

US 2012/0091489 A1   Apr. 19, 2012

(30) Foreign Application Priority Data

Oct. 15, 2010   (JP) .................................. 2010-232452

(51) Int. Cl.
 *H01L 27/15* (2006.01)
 *H01L 29/267* (2006.01)
 *H01L 31/12* (2006.01)
 *H01L 33/00* (2010.01)

(52) U.S. Cl.
 USPC ................. 257/81; 257/79; 257/99; 257/431; 257/447; 257/666; 257/E33.001

(58) Field of Classification Search
 USPC ......... 257/79, 81, 99, 431, 447, 666, E33.001
 See application file for complete search history.

(56) References Cited

U.S. PATENT DOCUMENTS

| | | | |
|---|---|---|---|
| 7,952,113 B2 * | 5/2011 | Layer et al. | 257/99 |
| 2007/0152231 A1 * | 7/2007 | Destain | 257/99 |
| 2011/0108857 A1 * | 5/2011 | Rindt et al. | 257/81 |

FOREIGN PATENT DOCUMENTS

JP   2004-241509 A   8/2004

* cited by examiner

*Primary Examiner* — Michelle Mandala
(74) *Attorney, Agent, or Firm* — Holtz, Holtz, Goodman & Chick, PC

(57) ABSTRACT

A frame body surrounding a perimeter of each light-emitting element is provided one surface of a substrate. Glass films having apertures are formed on the substrate by glass printing to form the frame body.

8 Claims, 7 Drawing Sheets

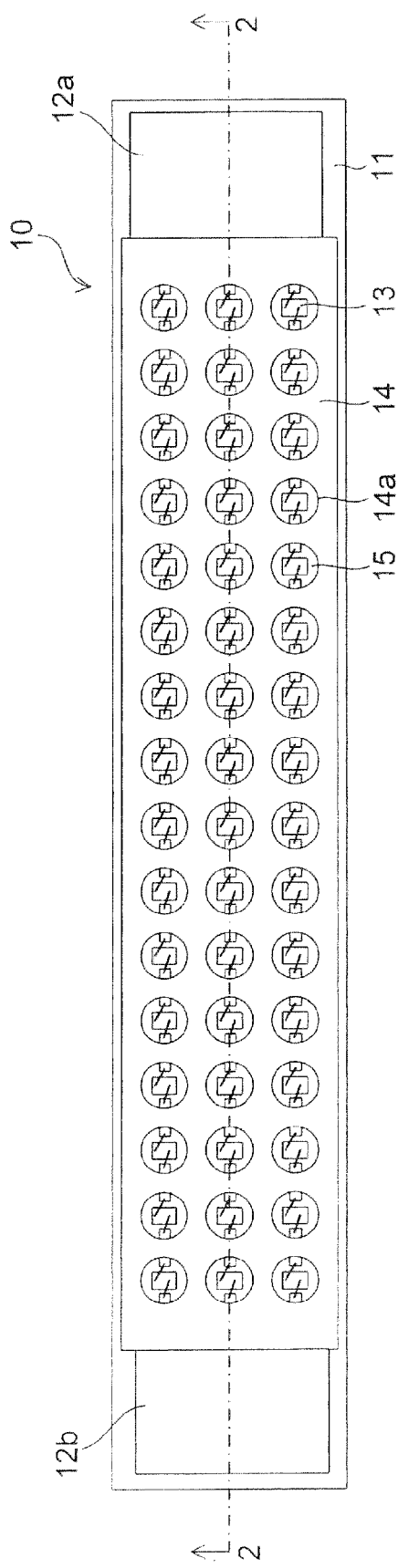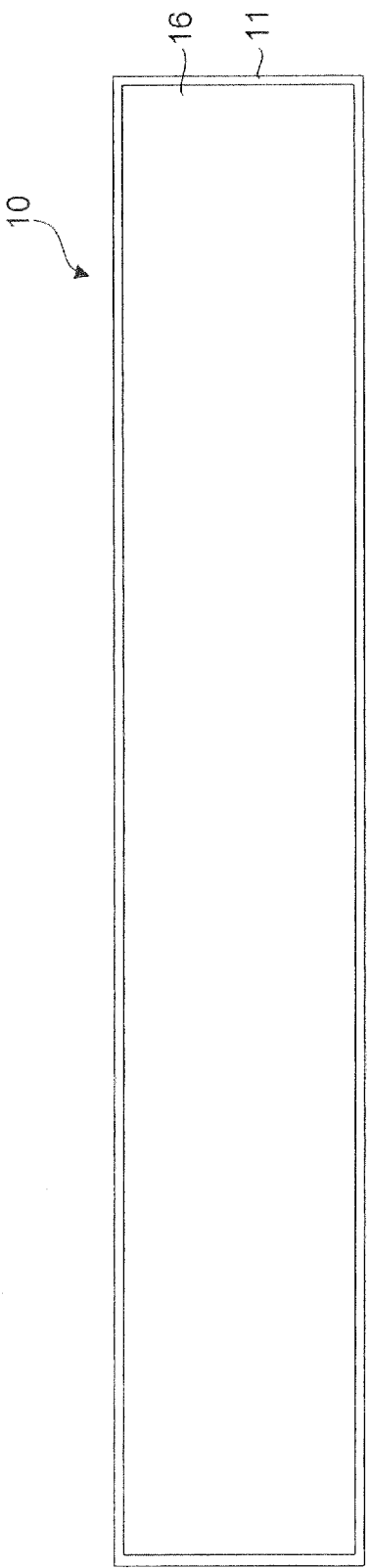

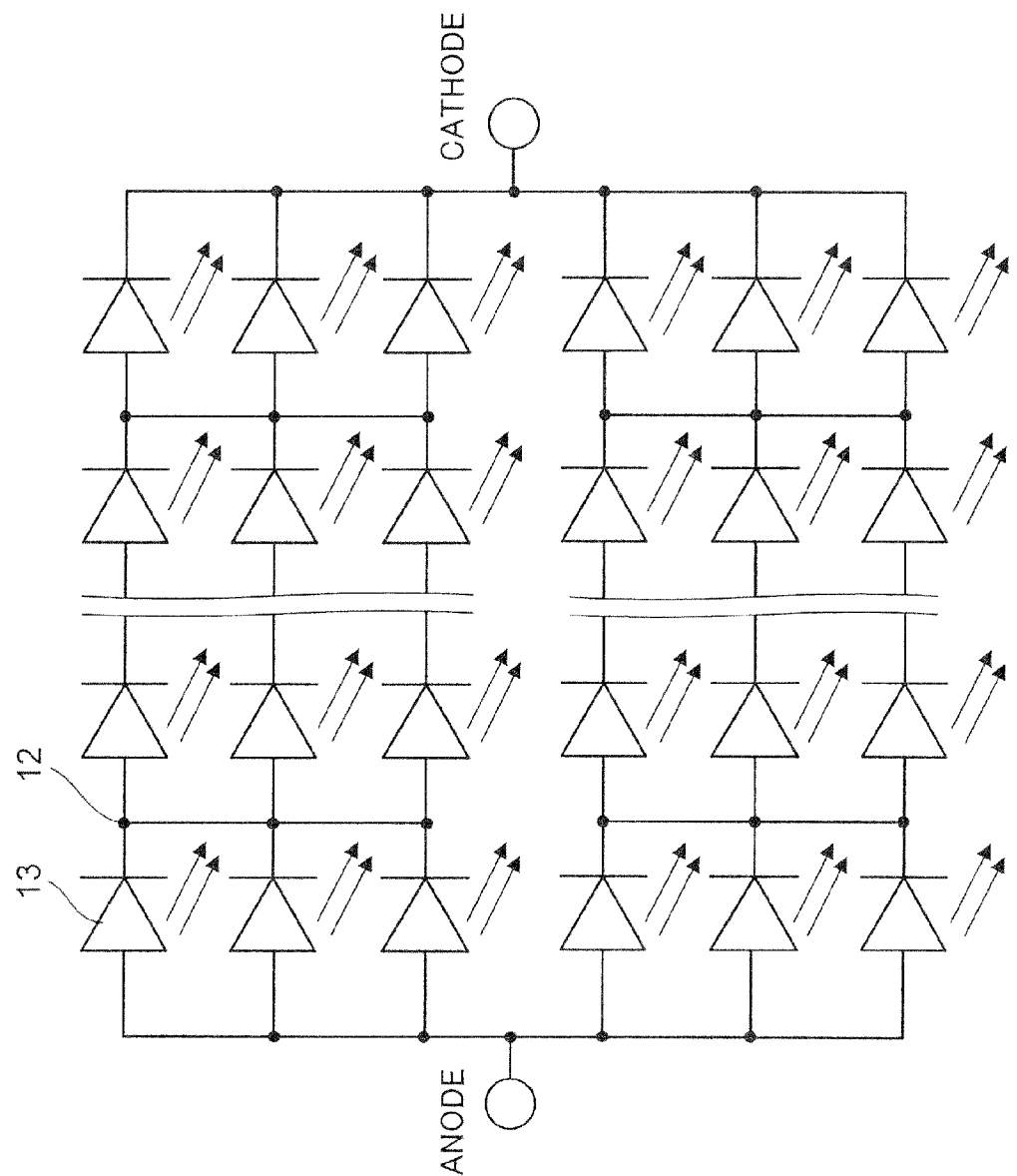

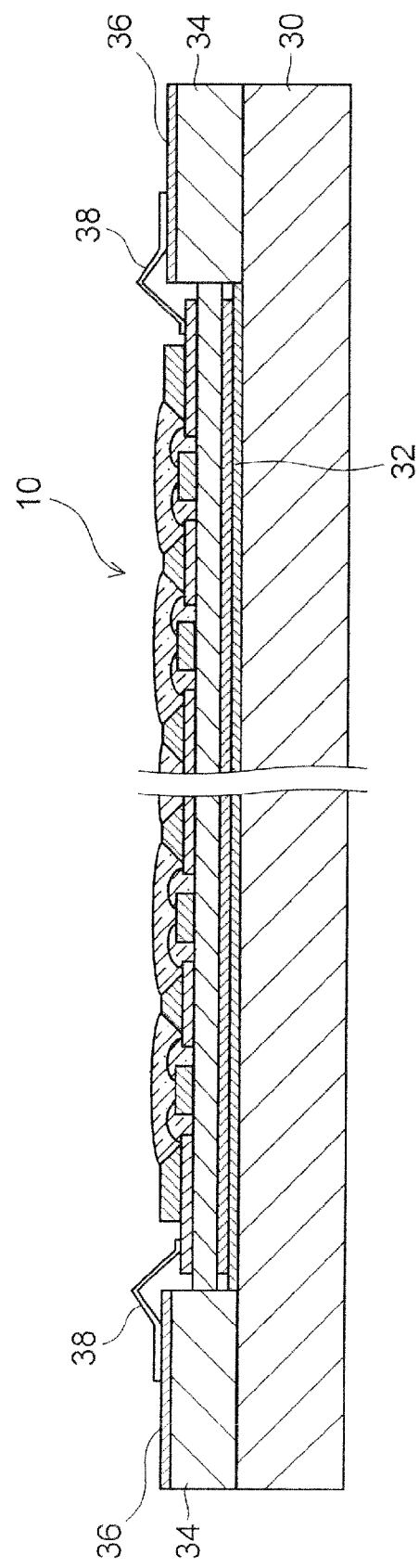

SUBSTRATE FOR MOUNTING LIGHT-EMITTING ELEMENTS, LIGHT-EMITTING DEVICE, AND METHOD FOR MANUFACTURING SAME

BACKGROUND OF THE INVENTION

1. Field of the Invention

The present invention relates to a light-emitting device and a substrate for mounting light-emitting elements, and particularly relates to a high-flux (high-output) light-emitting device in which a plurality of LED (light-emitting diode) elements are mounted on a substrate, and to a substrate for the light-emitting device.

2. Description of the Related Art

With the recent increase in awareness toward environmental protection, high-flux (high-output) light-emitting devices in which LED elements are mounted are being used in various illumination devices instead of incandescent light bulbs and fluorescent lights.

Examples of high-flux light-emitting devices include those in which comparatively large-size and high-power LED elements are mounted, and those in which high output can be obtained by mounting a plurality of comparatively small-size and small-power LED elements. The latter are often more advantageous in terms of diffusing the heat source and electric current, luminous efficiency, and the cost per element surface area.

There is disclosed in Patent Document 1 (JP-A 2004-241509) an LED light source comprising a plurality of LED elements mounted on a print substrate, a reflective plate which has a plurality of apertures provided in correspondence with the LED elements and in which the lower surface is joined to the print substrate via an adhesive, and an encapsulation resin packed into each of the apertures. It is also noted that the reflective plate is composed of aluminum, and is manufactured by press working.

SUMMARY OF THE INVENTION

In affixing a reflective plate such as shown in Patent Document 1 to a print substrate using an adhesive, adhesive seeps out from the lower surface of the reflective plate and penetrates the apertures, exerting a negative influence on the optical output. The seeping adhesive also clings to the bonding wire, and there is concern that stress due to differences in the coefficient of thermal expansion between the encapsulation resin and the adhesive will cause the bonding wire to break. The reflective plate is molded by press working, and therefore modifications of the design of the reflective plate, specifically, modifying the shape or size of the apertures, modifying the thickness of the reflective plate, and other such modifications necessitate creation of a new die and incur cost. Therefore, it is difficult to flexibly design or manufacture variations of the product.

An object of the present invention, which was perfected by taking the aforementioned points into consideration, is to provide a substrate for mounting light-emitting elements that can flexibly design or manufacture variations of the product, a light-emitting device, and a manufacturing method therefor; and in particular a light-emitting device having a plurality of LED elements on a substrate and a frame body surrounding the perimeter of each of the LED elements, wherein it is possible to form the frame body on the substrate without using an adhesive.

A substrate for mounting light-emitting elements of the present invention is a substrate for mounting light-emitting elements provided with a frame body on one surface of the substrate, wherein the frame body is composed of a layered body of a plurality of glass films having apertures and being layered in a light-projecting direction, and an area of the apertures in the glass film adjoining the substrate is less than an area of the apertures in another glass film.

A method for manufacturing the substrate for mounting light-emitting elements of the present invention comprises a step of providing the glass films by printing.

A light-emitting device of the present invention, the light-emitting device having the substrate for mounting light-emitting elements, wherein the light-emitting device has light-emitting elements mounted on the substrate in positions corresponding to the apertures of the frame body.

A method for manufacturing a light-emitting device of the present invention, comprising the steps of forming a frame body for surrounding each of a plurality of light-emitting element mounting regions on one surface of a substrate, and mounting a light-emitting element in each of the light-emitting element mounting regions on the substrate subsequent to forming the frame body; wherein the step for forming the frame body includes a step for carrying out glass printing several times, and providing the substrate with a plurality of layered glass films having a plurality of apertures.

Since a frame body is provided on the substrate without using an adhesive in the substrate for mounting light-emitting elements and the light-emitting device of the present invention, it is possible to eliminate the negative influence on optical output and reliability due to seepage of the adhesive. The frame body in the present invention can be formed by glass printing, and it is therefore possible to flexibly design or manufacture variations of the product.

BRIEF DESCRIPTION OF THE DRAWINGS

FIG. 1A is a plan view showing the structure of a semiconductor light-emitting device using a substrate for mounting light-emitting elements according to an embodiment of the present invention, and FIG. 1B is a bottom view;

FIG. 4 is an equivalent circuit diagram of the semiconductor light-emitting device using the substrate for mounting light-emitting elements according to an embodiment of the present invention;

FIG. 6 is a cross-sectional view showing the packaged form of the semiconductor light-emitting device using the substrate for mounting light-emitting elements according to another embodiment of the present invention.

Embodiments of the present invention will be described below with reference to the drawings, but the present invention is not limited thereto. In the drawings cited below, the same reference numerals are given to substantially the same or equivalent components and parts.

[Embodiment 1]

Figure 2:
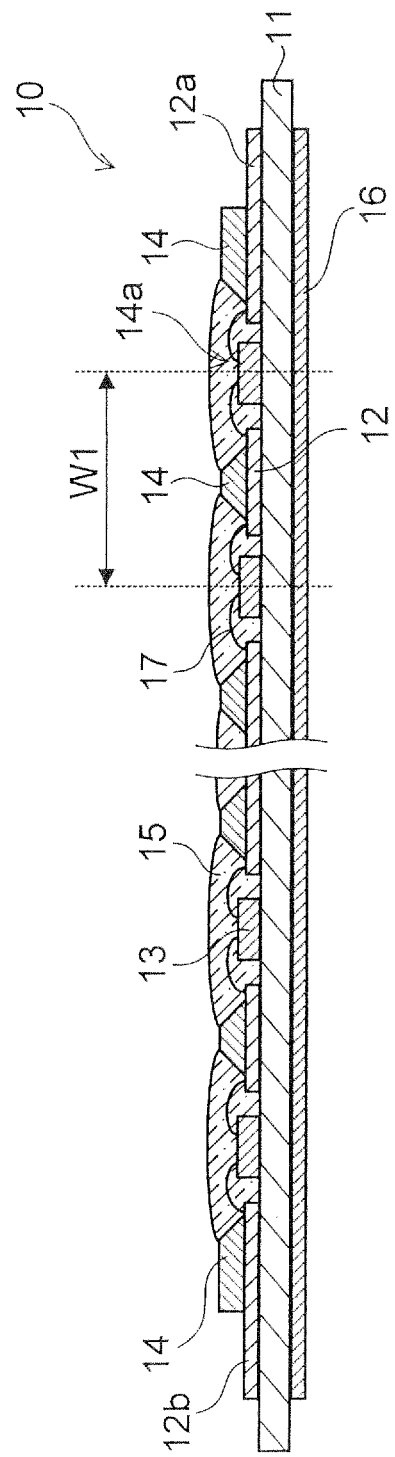
FIG. 2 is a cross-sectional view along line 2-2 in FIG. 1A.

FIG. 1A is a plan view seen from the light emission surface of a semiconductor light-emitting device 10 using the substrate for mounting light-emitting elements of the present invention, and FIG. 1B is a bottom view seen from the rear surface.

A rectangular alumina ceramic substrate can be used as an element-mounting substrate 11. Conductor wiring 12 and two feeder terminals 12a and 12b connected to the conductor wiring 12 are formed on the element-mounting surface of the element-mounting substrate 11. The feeder terminals 12a and 12b correspond to an anode terminal and a cathode terminal, respectively, and are disposed on both end of the element-mounting surface of the element-mounting substrate 11. The element-mounting substrate 11 has an element-mounting region for mounting a plurality of LED elements 13 on the element-mounting surface.

Figure 3:
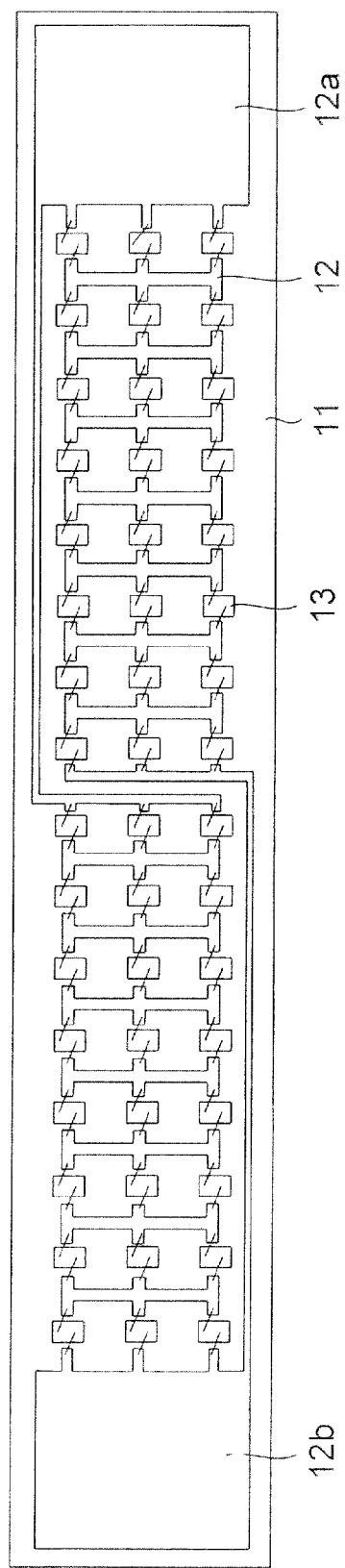
FIG. 3 is a plan view showing the structure of conductor wiring on a substrate for mounting light-emitting elements according to an embodiment of the present invention.

The plurality of LED elements 13 are mounted on the element-mounting substrate 11 in rows and columns. Each of the LED elements 13 can be fixed on the element-mounting substrate 11 using, for example, a thermosetting resin adhesive or the like, and can be electrically connected to the conductor wiring 12 by a bonding wire 17. FIG. 3 is a plan view showing a wiring pattern of the conductor wiring 12 on the element-mounting substrate 11. FIG. 4 is an equivalent circuit diagram showing the circuit structure of the semiconductor light-emitting device 10 realized by the wiring pattern. Forty-eight LED elements 13 can be connected to each other by the conductor wiring 12 in a state in which two 3×8 matrix connections are arranged side-by-side. Each of the LED elements 13 is a small- or medium-power light-emitting element that is, for example, 1.0 mm or less on a side, and blue LED elements containing a GaN-type semiconductor layer can be used.

A reflector 14 can be formed of a substance containing titanium oxide ($TiO_2$), barium sulfate ($BaSO_4$), or the like as the light-scattering particles in, for example, a borosilicate glass or other glass material. Containing the light-scattering particles makes it possible to increase the quantity of light in the light-projecting direction and improve the luminous efficiency. The reflector 14 has a plurality of apertures 14a for forming light-reflecting frame (frame body) that surrounds the perimeter of each of the LED elements 13. Specifically, the apertures 14a are provided corresponding to each of the LED elements 13. The reflector 14 can be formed by, for example screen printing and firing.

The reflector 14 is directly joined to the element-mounting surface of the element-mounting substrate 11 without the use of an adhesive. The thickness in the light-projecting direction of the reflector 14 can be set at, for example, about 420 μm, and can be made greater than the thickness of the LED elements 13 in the light-projecting direction. Specifically, the upper surface of the reflector 14 is positioned higher than the upper surface of the LED elements 13. The area above the feeder terminals 12a, 12b is not covered by the glass films that form the reflector 14; it is exposed.

The side wall of the apertures 14a of the reflector 14 is inclined so that the angle of the wall with the element-mounting surface is about 45°, and in this case each of the apertures 14a has a "mortar shape." In other words, the diameter (or the area) of the apertures 14a increases along the light-projecting direction. The reflector 14 forms the light-reflecting frame and defines the light-emitting regions. Specifically, light emitted from the LED elements 13 and spread toward the side is reflected by the light-reflecting frame, and directed toward the front in the light-projecting direction. The distance W1 between mutually adjacent apertures 14a (i.e., distance between mutually adjacent LED elements 13) can be set to, for example, 2.8 mm.

An encapsulation resin 15 is packed into each of the apertures 14a of the reflector 14, and is formed so that the LED elements 13 and the bonding wire 17 are buried in the encapsulation resin 15 in the apertures 14a. A light-transmissive silicone resin, an epoxy resin, a urethane resin, or the like can be used as the encapsulation resin 15. A YAG:Ce phosphor obtained by introducing Ce (cerium) as an activator into YAG (yttrium/aluminum/garnet: $Y_3Al_5O_{12}$), for example, can be dispersed in the encapsulation resin 15. The phosphor absorbs, for example, blue light having a luminescence peak of about 460 nm emitted from the LED elements 13, and converts the blue light to yellow light having a luminescence peak of about 560 nm. In this case, white light is emitted from the light emission surface of the semiconductor light-emitting device 10 by mixing yellow light converted by the phosphor and blue light transmitted through the encapsulation resin 15 without wavelength conversion.

The surface (hereinafter referred to as "rear surface") which is opposite side of the element-mounting surface of the element-mounting substrate 11 can be a packaging surface when the semiconductor light-emitting device 10 is packaged on a packaging substrate (i.e., light-emitting device mounting substrate) or a heat dissipation plate. In this case, the conductor wiring and the feeder terminals are not provided on the rear surface of the element-mounting substrate 11. A rear surface glass 16 can be provided on the rear surface of the element-mounting substrate 11 so as to extend over substantially the entire region of the rear surface. A glass material having the same coefficient of thermal expansion as the glass material that forms the reflector 14 is preferably used as the rear surface glass 16, and a glass material having the same composition as the glass material that forms the reflector 14 is more preferable. The thickness of the rear surface glass 16 can be less than the thickness of the glass that forms the reflector 14, and can, for example, be 150 μm.

The rear surface glass 16 has an effect of suppressing warping of the element-mounting substrate 11. Specifically, the element-mounting substrate 11 is composed of alumina ceramic and has a coefficient of thermal expansion that is different from that of the glass films that form the reflector 14 provided to the element-mounting surface. When heat is applied in a condition in which materials having mutually different coefficients of thermal expansion are bonded, warping is induced on these materials because the material having a lower coefficient of thermal expansion cannot follow the thermal expansion of the other material having a higher coefficient of thermal expansion. The coefficient of thermal expansion of the reflector 14 is higher than the coefficient of thermal expansion of the element-mounting substrate 11, and therefore warping can be induced such that the element-mounting surface bends convexly in cases in which the rear surface glass 16 is not formed. When warping is induced on the element-mounting substrate 11 in cases in which the element-mounting substrate 11 is used by being joined to a packaging substrate or a heat dissipation plate, the heat dissipation properties are deteriorated because of degraded the bonding properties between the element-mounting substrate 11 and the packaging substrate or a heat dissipation plate. Deterioration in the heat dissipation properties is the principal cause for reduction in luminous efficiency and for brightness irregularities among the LED elements, and is also the principal cause for the shortening of service life of the LED elements 13. A rear surface glass 16 having the same level of coefficient of thermal expansion as do the glass films that form the reflector 14 is also formed on the rear surface of the element-mounting substrate 11, as in the present embodiment, whereby warp-inducing stress is produced on both surfaces of the element-mounting substrate 11. As a result, the stresses are cancelled out, and warping of the element-mounting substrate 11 can be minimized or prevented. The glass material of the rear surface glass 16 is selected so that the magnitude correlation of the coefficient of thermal expansion of the rear surface glass 16 relative to the element-mounting substrate 11 corresponds to the magnitude correlation of the coefficient of thermal expansion of the reflector 14 relative to the element-mounting substrate 11 in order to cancel out the stresses. When the coefficient of thermal expansion of the reflector 14 is higher than the coefficient of thermal expansion of the element-mounting substrate 11, a glass material having a higher coefficient of thermal expansion than that of the element-mounting substrate 11 is used as the rear surface glass 16, and vice versa.

The rear surface glass 16 is provided to the packaging surface, and because of the need to ensure the good heat dissipation properties, it is preferable that the rear surface glass 16 be as thin as possible while still capable of preventing the element-mounting substrate from being warped.

Specifically, 40 to 200 μm is preferable, and 50 to 190 μm is more preferable. The thickness of the rear surface glass 16 can be reduced by making an area in which the rear surface glass 16 covers the element-mounting substrate 11 greater than an area in which the reflector covers the element-mounting substrate 11. In the present embodiment, while the reflector 14 has a plurality of apertures 14a and the reflector 14 is not formed on the feeder terminals 12a, 12b, the rear surface glass 16 is formed over substantially the entire rear surface of the element-mounting substrate 11. Therefore the area in which the rear surface glass 16 covers the element-mounting substrate 11 is greater than the area in which the reflector 14 covers the element-mounting substrate 11.

In addition, the surface (the surface adjoining the packaging substrate) of the rear surface glass 16 is preferably flat, and the surface roughness is preferably 10 μm or less. In cases in which bonding material 32 such as silicone grease, a heat dissipation sheet, or the like is interposed between the rear surface glass 16 and the packaging substrate or the heat dissipation plate to join the element-mounting substrate 11 to the packaging substrate or the heat dissipation plate, the formation of gaps between the bonding material 32 and the rear surface glass 16 is prevented, the bonding properties between the rear surface glass 16 and the packaging substrate or the heat dissipation plate is improved, and good heat dissipation properties are obtained by keeping the rear surface glass 16 flat. The rear surface glass 16 can be made into a flat surface by, for example, performing multiple firing.

A method for manufacturing the substrate for mounting light-emitting elements and the semiconductor light-emitting device 10 using the substrate for mounting light-emitting elements according to an embodiment of the present invention will be described below with reference to FIGS. 5A to 5E.

Figure 5A:
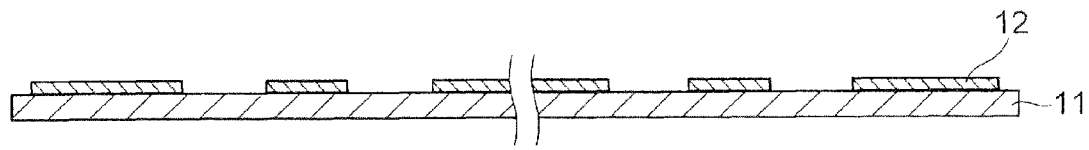
FIGS. 5A to 5E are views showing the method for manufacturing the semiconductor light-emitting device using the substrate for mounting light-emitting elements according to an embodiment of the present invention.

First, a fired alumina ceramic substrate, which will be the base material of the element-mounting substrate 11, is prepared. The alumina ceramic substrate may be perforated or the like as necessary prior to firing. A conductive paste, which is the material for forming the conductor wiring 12 and the feeder terminals 12a, 12b, is prepared. The conductive paste is produced by dispersing a metal powder, which is the principal ingredient for forming a conductor, and various additives (inorganic binder, glass frit, filler, and the like), which are added as necessary, in an organic medium (vehicle). The conductive paste is printed on the surface of the alumina ceramic substrate by screen printing or another general method. The conductor wiring 12 having a specified wiring pattern and the feeder terminals 12a, 12b are then formed on the alumina ceramic substrate by being fired at an appropriate temperature to obtain the element-mounting substrate 11 (FIG. 5A).

Figure 5B:
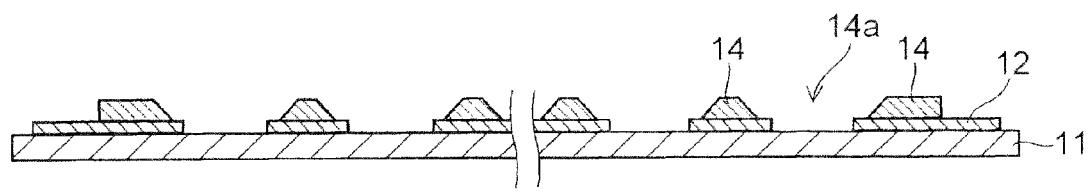

The reflector 14 is then formed on the element-mounting surface of the element-mounting substrate 11. A glass paste, which is the material for the reflector 14, is prepared. The glass paste is produced by dispersing a glass powder in which the principal ingredients are $SiO_2$, $B_2O_3$, $Al_2O_3$, and the like, and titanium oxide ($TiO_2$), barium sulfate ($BaSO_4$), or other light-scattering particles in an organic medium (vehicle). The glass paste is printed and coated on the element-mounting surface of the element-mounting substrate 11 by screen printing. A mesh mask having a plurality of round shielding parts that correspond to the apertures 14a of the reflector 14 can be used during the screen printing. The glass paste is then fired at an appropriate temperature. The glass films that form the reflector 14 can be obtained by alternating printing and firing until the desired thickness is attained. For example, a glass film of thickness 40 um is formed in a single printing and firing. A plurality of glass films are layered by several times printing and firing to form the reflector 14 of thickness about 420 um. During the multiple printing, several kinds of mesh masks are used. These mesh masks are different in diameters of the shielding parts from each other. The mesh mask having larger shielding parts is used as the number of times of printing proceeds. Specifically in the glass films constituting the frame body, an area of the apertures of the glass film (lowermost glass film) adjoining the substrate can be less than an area of the apertures of the uppermost glass film. In other words, in the glass films constituting the frame body, a size of the apertures of the glass film of lower layer can be smaller than a size of the apertures of the glass film of upper layer. Here, an "upper layer" is a layer formed above (in the forward light-projecting direction) an arbitrary layer among the plurality of glass films, and a "lower layer" is a layer formed below (in the rearward light-projecting direction) the arbitrary layer. Appropriately changing the size of the apertures of the plurality of glass films makes it possible to form the inclined reflector 14 composed of glass films and in which the side walls of the apertures 14a have a mortar-shaped incline. The side walls of the apertures 14a can be set at about 45° when printing and firing are repeated so that increasing amount of the height of the layered body correspond to the increasing amount of the diameter of the apertures (FIG. 5B).

Figure 5C:
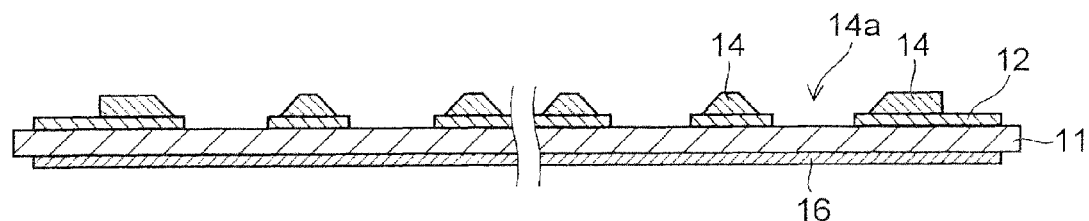

The rear surface glass 16 is then formed on the rear surface of the element-mounting substrate 11. The rear surface glass 16 may be formed by screen printing and firing a glass paste having the same components as the reflector 14. The printing and firing may be carried out several times until the rear surface glass 16 has the desired thickness (for example, 150 μm). The repeated firing can produce a smooth flat surface on the rear surface glass 16. The rear surface glass 16 can be formed so as to extend over substantially the entire rear surface of the element-mounting substrate 11 (FIG. 5C). The substrate for mounting the light-emitting elements is completed through the above steps.

Figure 5D:
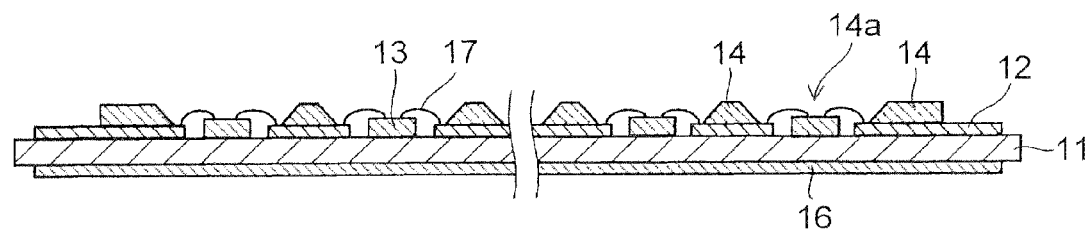

The following steps are steps for manufacturing the light-emitting device which uses the light-emitting element-mounting substrate produced through the aforementioned steps. The element-mounting regions of the element-mounting substrate 11 exposed in the apertures 14a of the reflector 14 are coated with a thermosetting resin adhesive by a dispense method. The LED elements 13 are then mounted on the adhesive using a chip mounter. One LED element 13 is accommodated in each respective aperture 14a. Heat treatment is then performed to set the adhesive. The electrode of each of the LED elements 13 and the conductor wiring 12 are then connected by the bonding wire (FIG. 5D).

Figure 5E:
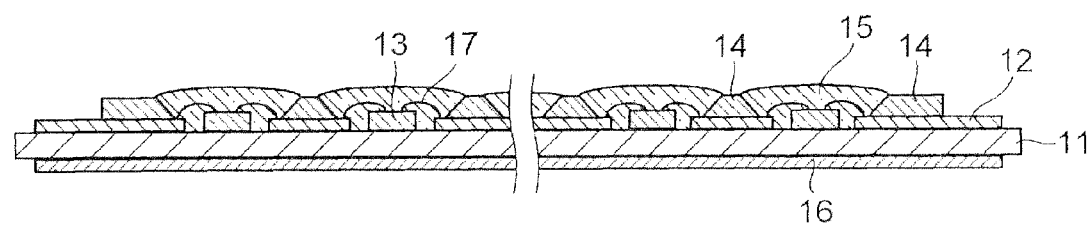

The encapsulation resin 15 composed of a phosphor-dispersed silicone resin is packed into each aperture 14a of the reflector 14 so as to bury the LED element 13 and the bonding wire 17. Heat treatment is then performed to set the encapsulation resin 15. A YAG:Ce phosphor obtained by introducing Ce as an activator into YAG, for example, can be used as the phosphor. The encapsulation resin 15 may be an epoxy resin or a urethane resin (FIG. 5E).

The semiconductor light-emitting device 10 is completed through the above steps.

FIG. 6 is a cross-sectional view showing a packaging embodiment of the semiconductor light-emitting device 10 using the substrate for mounting light-emitting elements of the present embodiment. The semiconductor light-emitting device 10 is packaged, for example, on a packaging substrate (i.e., light-emitting device mounting substrate) 30 constituting a luminaire. Here, the packaging substrate (or heat dissipation plate) includes a substrate used entirely for heat dissipation, regardless of the presence or absence of a circuit pattern. The packaging substrate 30 can be composed of, for example, Al having favorable heat conductivity, and is designed so that the heat generated from the LED elements 13 diffuses toward the packaging substrate 30. A bonding material 32 such as a heat dissipation sheet, silicone grease, or the other material having favorable heat conductivity can be provided between the rear surface glass 16 and the packaging substrate 30. Bondability between the packaging substrate 30 and the element-mounting substrate 11 is thereby ensured, improving the heat dissipation properties.

A wiring substrate 34 composed of glass epoxy resin or the like is provided on the packaging substrate 30 so as to be adjacent to the semiconductor light-emitting device 10. The wiring substrate 34 may have an aperture that allows the mounting regions of the semiconductor light-emitting device 10 on the packaging substrate 30 to be exposed. Conductor wiring 36 for supplying power to the semiconductor light-emitting device 10 is formed on the surface of the wiring substrate 34. A pair of connectors 38 extending toward the semiconductor light-emitting device 10 are connected to the conductor wiring 36. The distal ends of the connectors 38 are in contact with the feeder terminals 12a, 12b, and form spring contacts for applying bias force for pressing the semiconductor light-emitting device 10 against the packaging substrate 30. The semiconductor light-emitting device 10 can thereby be supplied with power, and the joining between the semiconductor light-emitting device 10 and the packaging substrate 30 is ensured.

As obvious from the above description, in the method for manufacturing a substrate for mounting light-emitting elements according to the present embodiment, the thickness of the reflector 14 and the shapes of the light-reflecting frame can be readily controlled because the reflector 14 is formed by performing glass printing several times. For example, the thickness of the reflector 14 can be controlled by reducing or increasing the number of times printing/firing is performed. The shapes and sizes of the light-reflecting frame can be modified only by modifying the mesh mask. It is accordingly possible to flexibly design or manufacture variations of the product.

In the method for manufacturing a substrate for mounting light-emitting elements according to the present embodiment, the reflector 14 can be formed on the element-mounting substrate 11 without using an adhesive, making it possible to prevent light output and reliability from being adversely affected by an excessively applied adhesive.

The semiconductor light-emitting device 10 using the substrate for mounting light-emitting elements according to the present embodiment has a configuration in which a plurality of LED elements 13 are mounted on the element-mounting substrate 11, thereby allowing the distance between mutually adjacent LED elements to be reduced as compared with a configuration in which each LED package having a single LED element is arrayed on the substrate. It is thereby possible to improve color mixture properties in a case where a plurality of luminescent colors is mixed together.

The light-reflecting frame of the semiconductor light-emitting device 10 using the substrate for mounting light-emitting elements according to the present embodiment is formed, and the light-emitting region are defined, by the apertures 14a of the reflector 14 provided in correspondence with each of the LED elements 13. It is thereby possible to reduce the distance between the LED elements 13 and the reflector 14. Accordingly, the difference in optical path length within the encapsulation resin 15 decreases between light transmitted in the vertical direction with respect to the light emission surface and light transmitted in a direction inclined with respect to the light emission surface, making it possible to suppress color irregularities in the luminescent colors and light absorption.

In the semiconductor light-emitting device 10 using the substrate for mounting light-emitting elements according to the present embodiment, the rear surface glass 16 composed of a glass material having the same composition as the glass material forming the reflector 14 is provided to the rear surface of the element-mounting substrate 11. It is therefore possible to minimize or eliminate warping induced on the element-mounting substrate 11 due to the difference in the coefficient of thermal expansion between the reflector 14 and the element-mounting substrate 11. This effect is more prominent in high-flux semiconductor light-emitting devices in which the area of the element-mounting substrate is comparatively large and a plurality of LED elements are mounted. Minimizing or eliminating warping of the element-mounting substrate 11 makes it possible to improve the bonding properties between the element-mounting substrate 11 and the packaging substrate 30, and to improve the heat dissipation properties. Not only is the luminous efficiency of the LED elements enhanced thereby, but the problem of a decrease in the service life of the LED elements is resolved. Uniform heat dissipation is ensured across the entire surface of the element-mounting substrate 11, and therefore brightness irregularities among the LED elements can be prevented. Improving heat dissipation makes it possible for the distances between LED elements to be reduced further, contributing to further enhancement of color mixture properties. The glass film that forms the rear surface glass 16 has better affinity with bonding material 32 such as silicone grease than the alumina ceramic that forms the element-mounting substrate 11. Specifically, by providing the rear surface glass 16 to the substrate for mounting light-emitting elements according to the present embodiment, the bonding properties between the element-mounting substrate 11 and the packaging substrate 30 can be improved for two different reasons, i.e., improved affinity between the rear surface glass 16 and the bonding material 32, in addition to the solution of warping of the element-mounting substrate 11.

[Embodiment 2]

Figure 7:
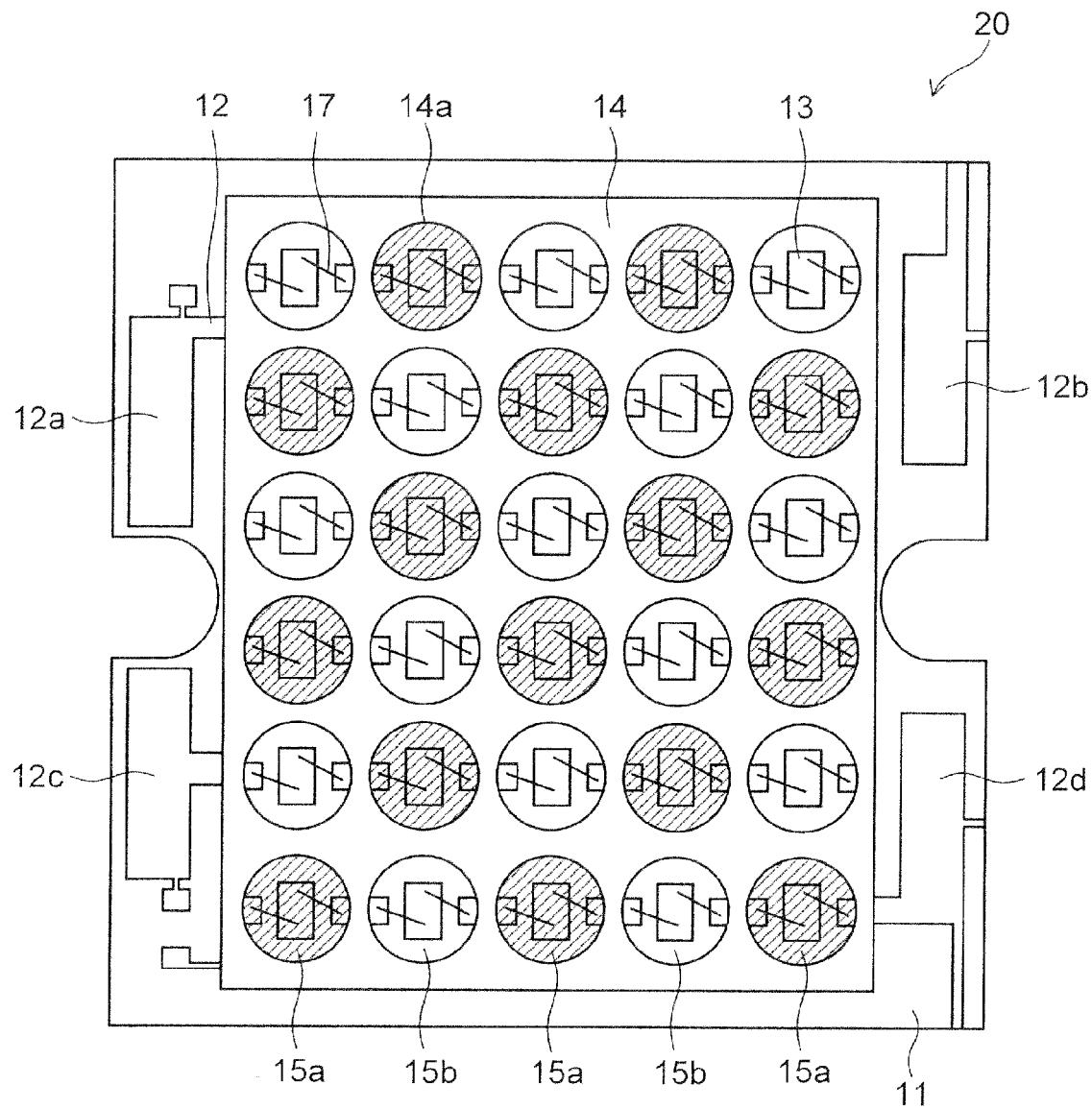
FIG. 7 is a plan view showing the structure of the semiconductor light-emitting device using the substrate for mounting light-emitting elements according to another embodiment of the present invention.

A substrate for mounting light-emitting elements according to a second embodiment of the present invention is described below with reference to the drawings. FIG. 7 is a plan view of a semiconductor light-emitting device 20 using the substrate for mounting light-emitting elements according to the second embodiment of the present invention, as seen from the light emission surface.

The semiconductor light-emitting device 20 has the same basic configuration as the aforedescribed semiconductor light-emitting device 10, and includes an element-mounting substrate 11 having conductor wiring 12, a plurality of LED elements 13 mounted on the element-mounting surface of the element-mounting substrate 11, a reflector 14 having a plurality of apertures 14a for forming light-reflecting frame that surrounds the perimeter of each of the LED elements 13, phosphor-containing encapsulation resins 15a and 15b packed into each of the apertures 14a, and a rear surface glass 16 extending over substantially the entire rear surface of the element-mounting substrate 11.

The semiconductor light-emitting device 20 is configured to generate two types of light having mutually different luminescent colors using the two types of encapsulation resins 15a and 15b containing phosphors having mutually different wavelength conversion characteristics. The two types of light are emitted from the light emission surface of the semiconductor light-emitting device 20 to mix.

The reflector 14 has a plurality of apertures 14a arrayed in five rows by six columns corresponding to the state in which the LED elements 13 are arrayed. The apertures 14a form the light-reflecting frame surrounding the perimeter of each of the light-emitting elements, and define the light-emitting regions. The two types of encapsulation resin 15a and 15b containing phosphors having mutually different wavelength conversion characteristics are packed into the apertures 14a so as to be the predetermined array. Part of the Y in the $Y_3Al_5O_{12}$ matrix of the phosphors is substituted by Gb, Tb, or the like, and part of the Al is substituted by Ga or the like, changing the matrix structure and thereby allowing the luminescence peak to be shifted to the longer wavelengths or the shorter wavelengths. For example, the first encapsulation resin 15a (shown by the cross-hatching in FIG. 7), which is designed for daylight colors, is packed into the apertures 14a, with alternate apertures skipped in the direction of the rows and in the direction of the columns. The second encapsulation resin 15b, which is designed for warm white colors, is packed into the remaining apertures 14a. Specifically, the first and second encapsulation resins 15a and 15b are arrayed so as to form staggered patterns. Such an arraying makes it possible to improve mixture properties of the luminescent color.

The conductor wiring 12 forms two circuit systems so as to make it possible for the quantity of light to be adjusted for each luminescent color. Specifically, the LED elements buried in the first encapsulation resin 15a and the LED elements buried in the second encapsulation resin 15b can be individually supplied with electricity via the conductor wiring 12. The feeder terminals 12a, 12b correspond to the anode terminal and the cathode terminal of the first system, and the feeder terminals 12c and 12d correspond to the anode terminal and the cathode terminal of the second system. This circuit configuration makes it possible for the luminescent colors to be adjusted between daylight colors and warm white colors. The conductor wiring 12 may be formed on the rear surface of the element-mounting substrate 11. In this case, the conductor wiring on the rear surface is connected to the conductor wiring of the element-mounting surface via a through-hole or the like.

In the embodiment described above, the LED elements and the conductor wiring are connected using bonding wire, but a flip-chip connection may also be used. The LED elements are also not limited to blue LEDs, and LEDs of any luminescent color may be used. The shape, size, and arraying of the reflector apertures can be modified as appropriate. Also, a plurality of LED elements may be accommodated within a single reflector aperture. In this case, the luminescent colors of the LED elements accommodated in the single aperture may be mutually different. The wavelength conversion characteristics of the phosphor may be selected as appropriate so as to obtain the desired luminescent color, and a phosphor-free encapsulation resin may also be used. The glass films that form the reflector and the rear surface glass may be of a glass material other than borosilicate glass.

The present invention has been described above with reference to the preferred embodiment. It shall be understood that various changes and modifications can be envisaged by those skilled in the art. All examples of such changes and modifications are considered to be included in the appended claims.

Japanese Patent Application 2010-232452, which is the basis of the present application, is incorporated herein by reference.

What is claimed is:

1. A substrate for mounting light-emitting elements provided with a frame body on one surface of the substrate, wherein:
   the frame body comprises a layered body of a plurality of glass films having apertures and being layered in a light-projecting direction;
   the frame body is directly joined to the one surface of the substrate;
   the frame body surrounds a light-emitting element mounting area of the substrate;
   the surface of the substrate on which the frame body is provided is on a light-emitting element mounting side of the substrate; and
   an area of the apertures in the glass film adjoining the substrate is less than an area of the apertures in the uppermost glass film.

2. The substrate for mounting light-emitting elements of claim 1, wherein the glass films are formed by printing.

3. A light-emitting device having the substrate for mounting light-emitting elements of claim 1, the light-emitting device having light-emitting elements mounted on the substrate in positions corresponding to the apertures of the frame body.

4. A substrate for mounting light-emitting elements provided with a frame body on one surface of the substrate, wherein:
   the frame body comprises a layered body of a plurality of glass films having apertures and being layered in a light-projecting direction;
   an area of the apertures in the glass film adjoining the substrate is less than an area of the apertures in the uppermost glass film; and
   the glass films include light-scattering particles.

5. A light-emitting device having the substrate for mounting light-emitting elements of claim 4, the light-emitting device having light-emitting elements mounted on the substrate in positions corresponding to the apertures of the frame body.

6. A substrate for mounting light-emitting elements provided with a frame body on a first surface of the substrate, wherein:
   the frame body comprises a layered body of a plurality of glass films having apertures and being layered in a light-projecting direction;
   an area of the apertures in the glass film adjoining the substrate is less than an area of the apertures in the uppermost glass film; and another glass film is provided on a second surface of the substrate.

7. The substrate for mounting light-emitting elements of claim 6, wherein a thickness of the glass film provided on the second surface of the substrate is less than a thickness of the frame body.

8. A light-emitting device having the substrate for mounting light-emitting elements of claim 6, the light-emitting device having light-emitting elements mounted on the substrate in positions corresponding to the apertures of the frame body.

* * * * *